US007017269B2

(12) United States Patent
White et al.

(10) Patent No.: US 7,017,269 B2
(45) Date of Patent: *Mar. 28, 2006

(54) SUSPENDED GAS DISTRIBUTION PLATE

(75) Inventors: John M. White, Hayward, CA (US); Ernst Keller, Sunnyvale, CA (US); Wendell T. Blonigan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/729,565

(22) Filed: Dec. 5, 2003

(65) Prior Publication Data

US 2004/0118345 A1 Jun. 24, 2004

Related U.S. Application Data

(62) Division of application No. 10/293,544, filed on Nov. 12, 2002, now Pat. No. 6,823,589, which is a division of application No. 09/488,612, filed on Jan. 20, 2000, now Pat. No. 6,477,980.

(51) Int. Cl.
*B23P 15/00* (2006.01)
*C23C 16/455* (2006.01)
*H01L 21/00* (2006.01)

(52) U.S. Cl. .................. 29/890.14; 29/428; 118/723 E; 118/715; 156/345.34

(58) Field of Classification Search .................. 29/428, 29/890.14; 118/715, 723 E; 156/345.34
See application file for complete search history.

(56) References Cited

U.S. PATENT DOCUMENTS

| | | | |
|---|---|---|---|
| 4,854,263 | A | 8/1989 | Chang et al. |
| 5,439,524 | A | 8/1995 | Cain |
| 5,567,243 | A | 10/1996 | Foster et al. |
| 5,582,866 | A | 12/1996 | White |
| 5,614,026 | A | 3/1997 | Williams |
| 5,628,829 | A | 5/1997 | Foster et al. |
| 5,647,911 | A | 7/1997 | Vanell et al. |
| 5,844,205 | A | 12/1998 | White |
| 5,846,332 | A | 12/1998 | Zhao |
| 5,882,411 | A | 3/1999 | Zhao |
| 5,968,276 | A | 10/1999 | Lei |
| 5,989,652 | A | 11/1999 | Ameen et al. |
| 5,994,678 | A | 11/1999 | Zhao |
| 5,997,649 | A | 12/1999 | Hillman |
| 6,079,356 | A | 6/2000 | Umotoy |
| 6,123,775 | A | 9/2000 | Hao |
| 6,170,432 | B1 | 1/2001 | Szapucki |
| 6,197,151 | B1 | 3/2001 | Kaji |

(Continued)

FOREIGN PATENT DOCUMENTS

EP 0 843 348 A2 5/1998

(Continued)

OTHER PUBLICATIONS

Webster's Third New International Dictionary, Unabridged, Merriam-Webster, 1993, p. 2091.

(Continued)

*Primary Examiner*—Jeffrie R. Lund
(74) *Attorney, Agent, or Firm*—Robert J. Stern

(57) ABSTRACT

A gas inlet manifold for a plasma chamber having a perforated gas distribution plate suspended by flexible side walls. The flexible suspension minimizes mechanical stress due to thermal expansion of the gas distribution plate. In another aspect, the suspension provides thermal isolation between the gas distribution plate and other components of the chamber.

15 Claims, 12 Drawing Sheets

U.S. PATENT DOCUMENTS

| | | | | |
|---|---|---|---|---|
| 6,254,742 | B1 | 7/2001 | Hanson et al. | |
| 6,302,057 | B1 | 10/2001 | Leusink et al. | |
| 6,364,949 | B1 | 4/2002 | Or et al. | |
| 6,477,980 | B1 * | 11/2002 | White et al. | 118/723 E |
| 6,527,908 | B1 | 3/2003 | Kanetsuki et al. | |
| 6,772,827 | B1 * | 8/2004 | Keller et al. | 165/53 |
| 6,823,589 | B1 * | 11/2004 | White et al. | 29/890.14 |
| 6,857,387 | B1 * | 2/2005 | Sun et al. | 118/723 E |
| 2002/0069968 | A1 * | 6/2002 | Keller et al. | 156/345.33 |
| 2003/0066607 | A1 * | 4/2003 | White et al. | 156/345.34 |
| 2004/0118345 | A1 * | 6/2004 | White et al. | 118/723 E |
| 2005/0000432 | A1 * | 1/2005 | Keller et al. | 118/715 |
| 2005/0183827 | A1 * | 8/2005 | White et al. | 156/345.34 |

FOREIGN PATENT DOCUMENTS

| | | | |
|---|---|---|---|
| JP | 63-187619 | A | 8/1988 |
| WO | WO 95/33866 | A1 | 12/1995 |
| WO | WO 99/25012 | A1 | 5/1999 |
| WO | WO 99/25895 | A1 | 5/1999 |

OTHER PUBLICATIONS

Singapore search report mailed Feb. 14, 2002 for Singapore application No. SG 200100299-7 (5 pages).

European search report mailed Aug. 31, 2001 for EP application No. 01300380.

European search report mailed May 23, 2001 for EP application No. 01300380.

* cited by examiner

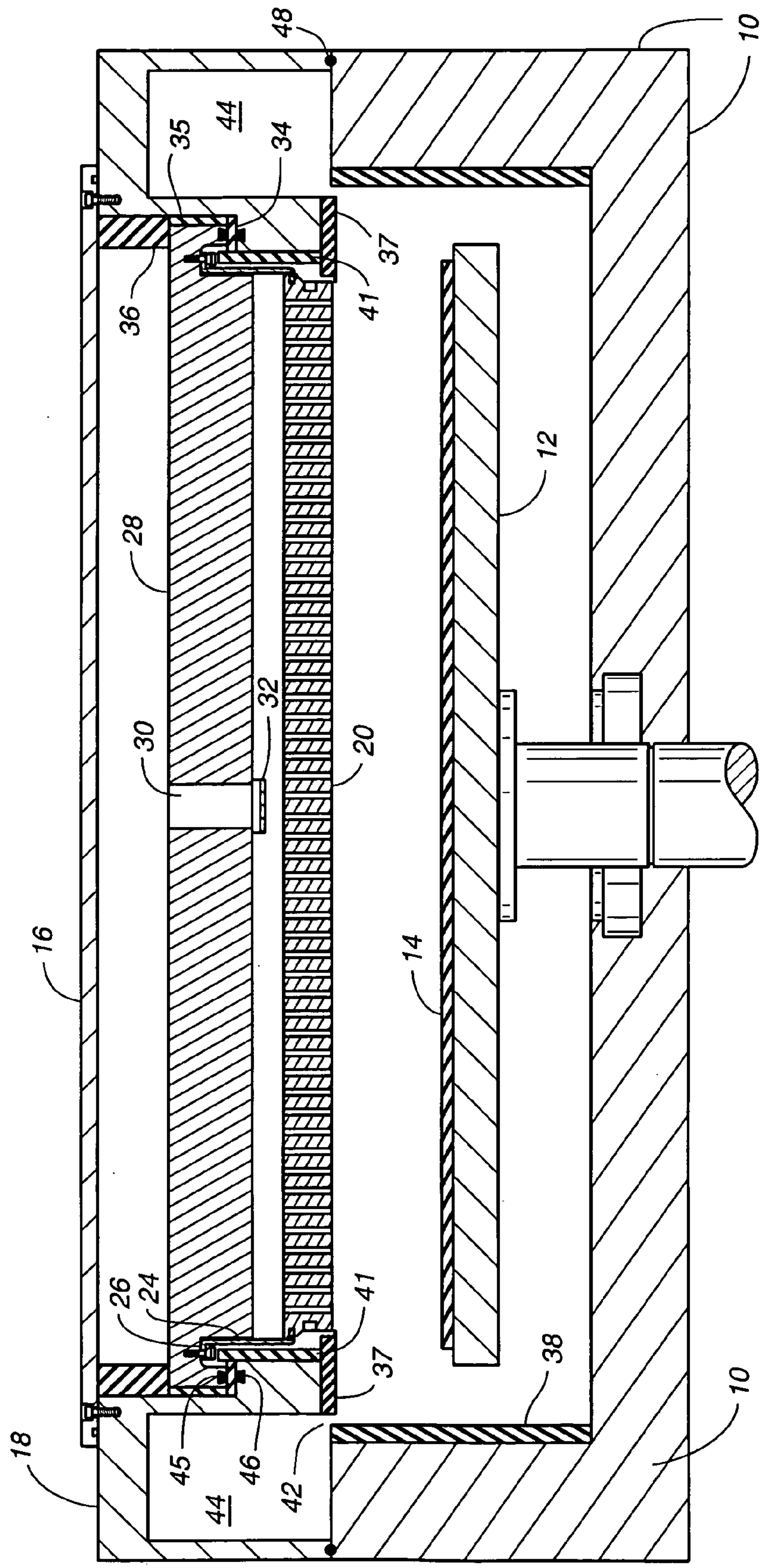
FIG._1

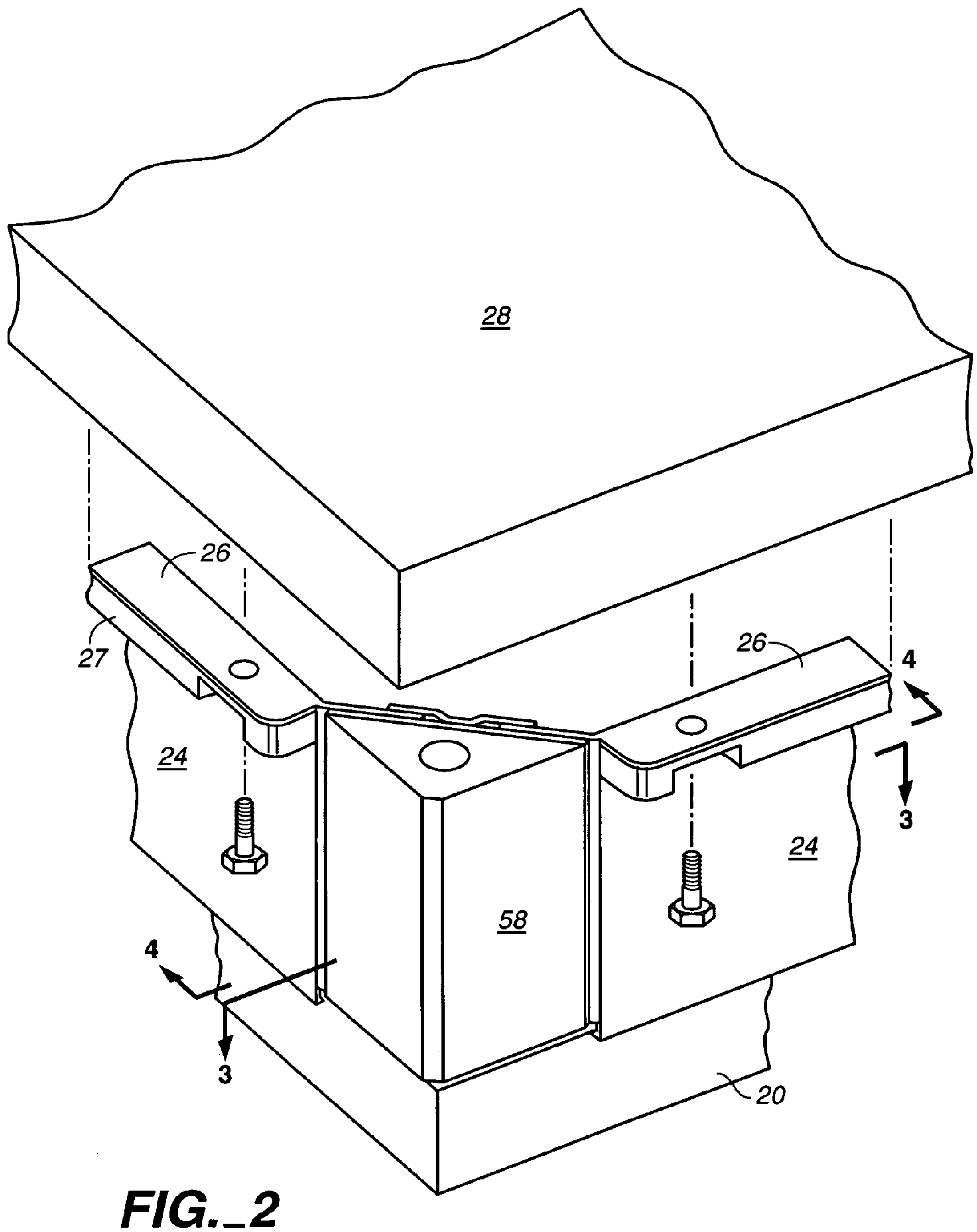
FIG._2

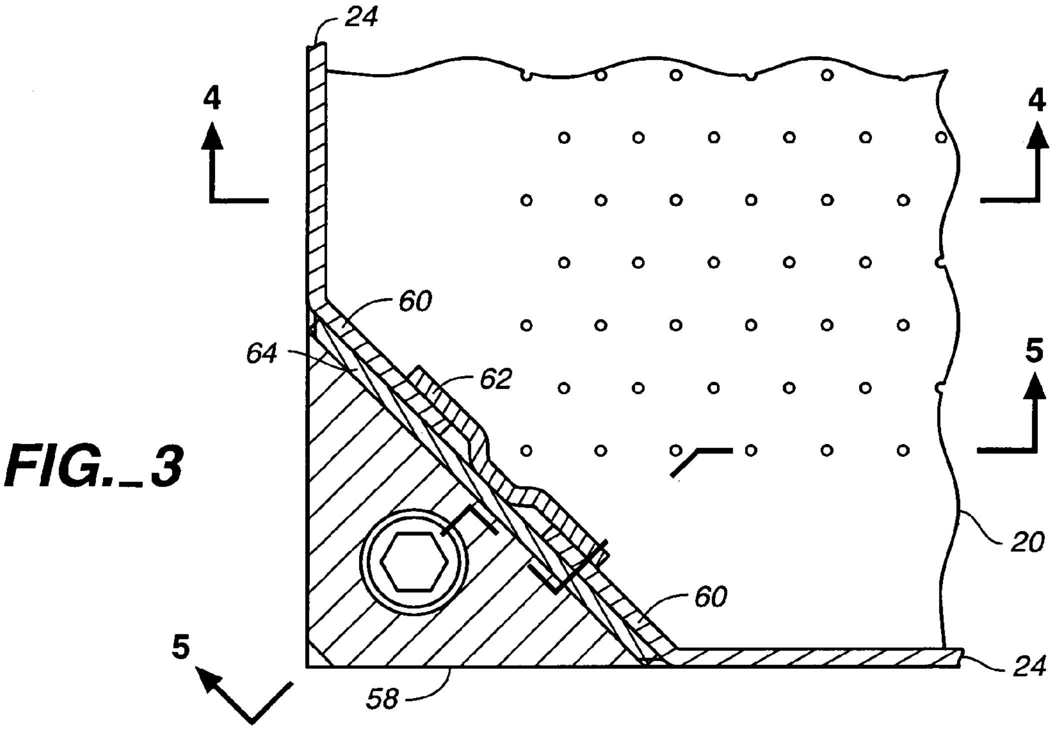
FIG._3
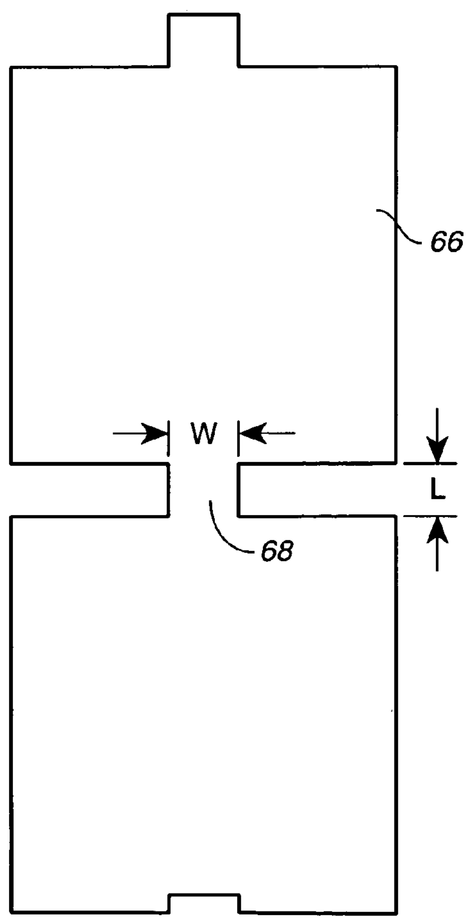
FIG._7

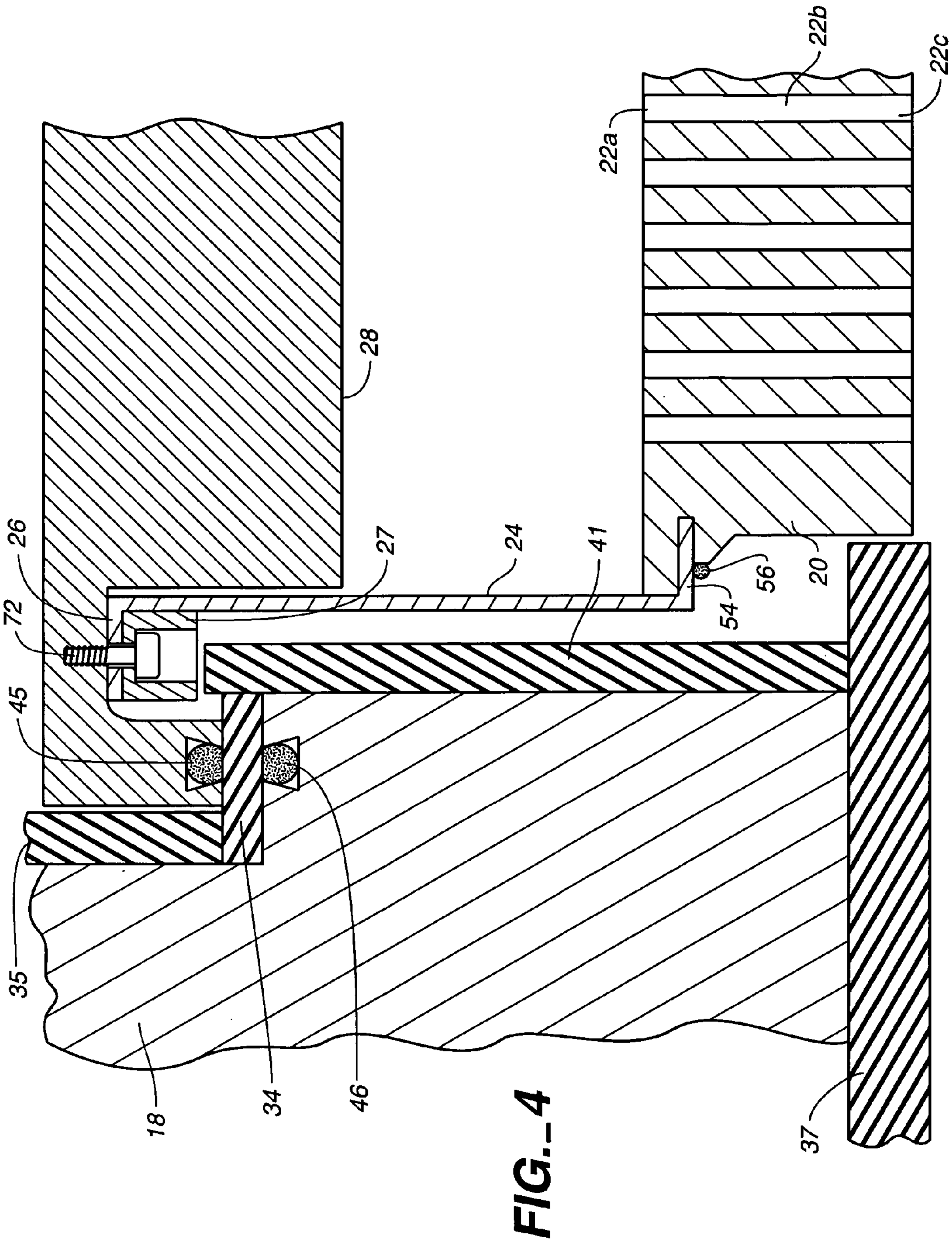
FIG._4

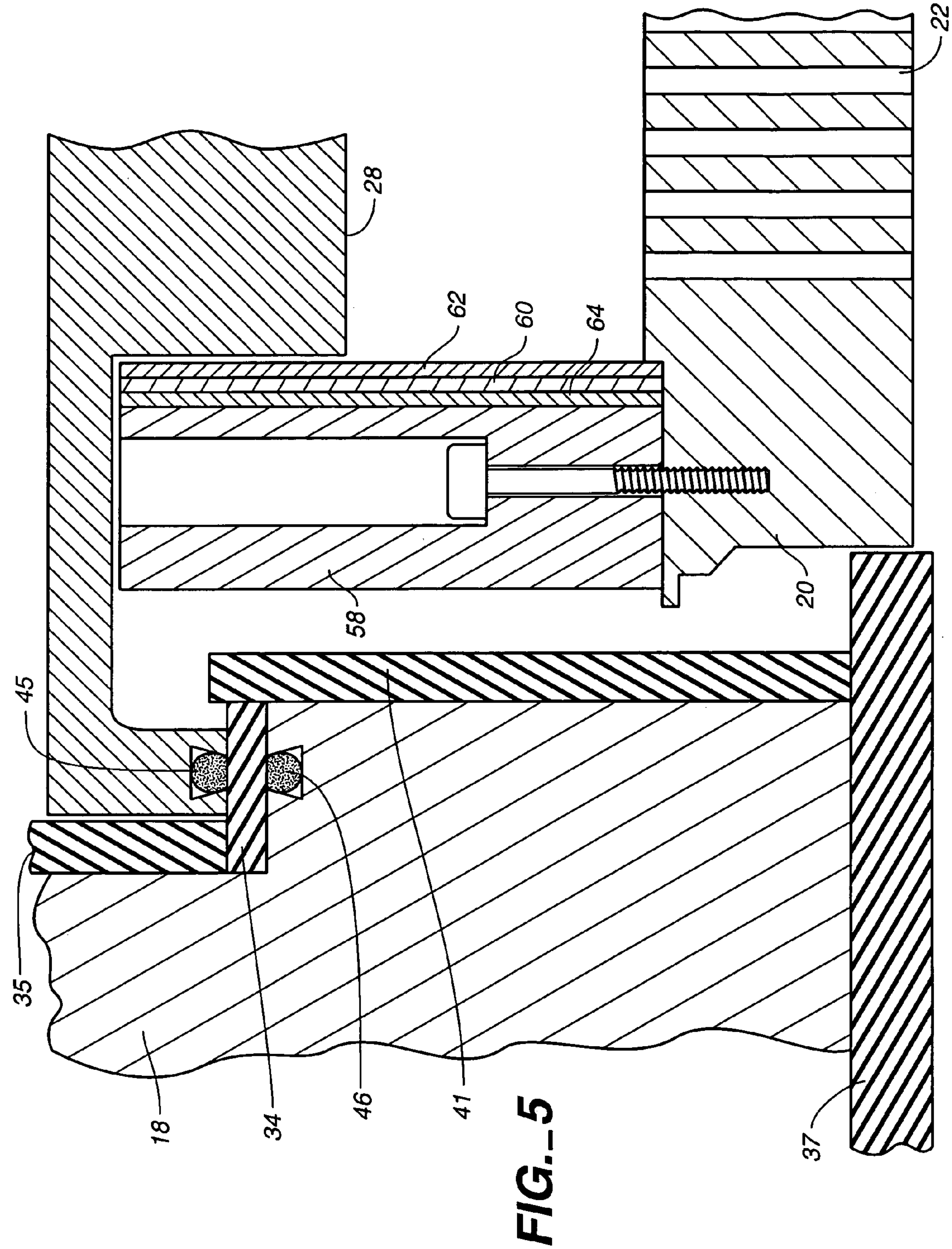
FIG._5

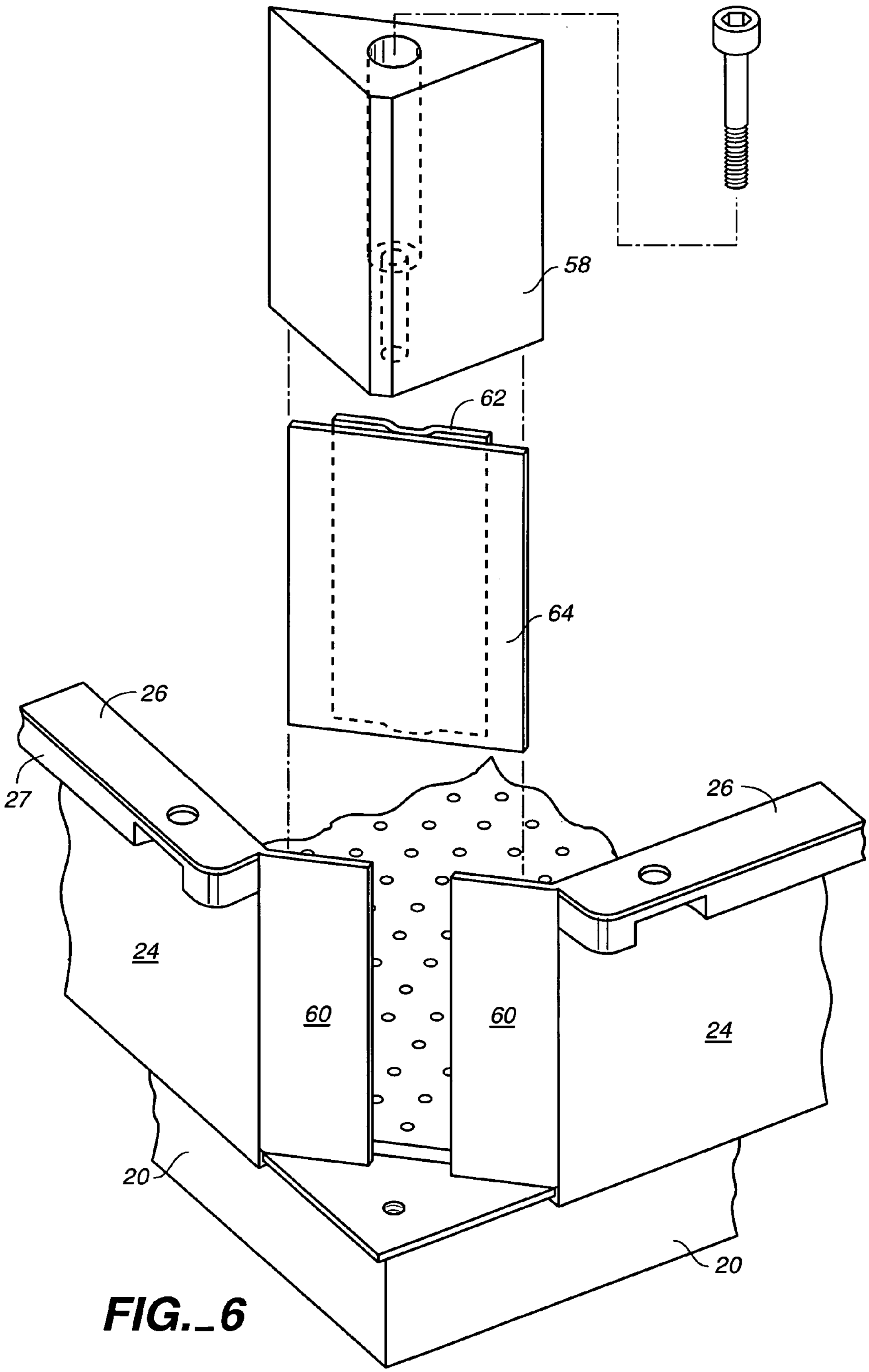
FIG._6

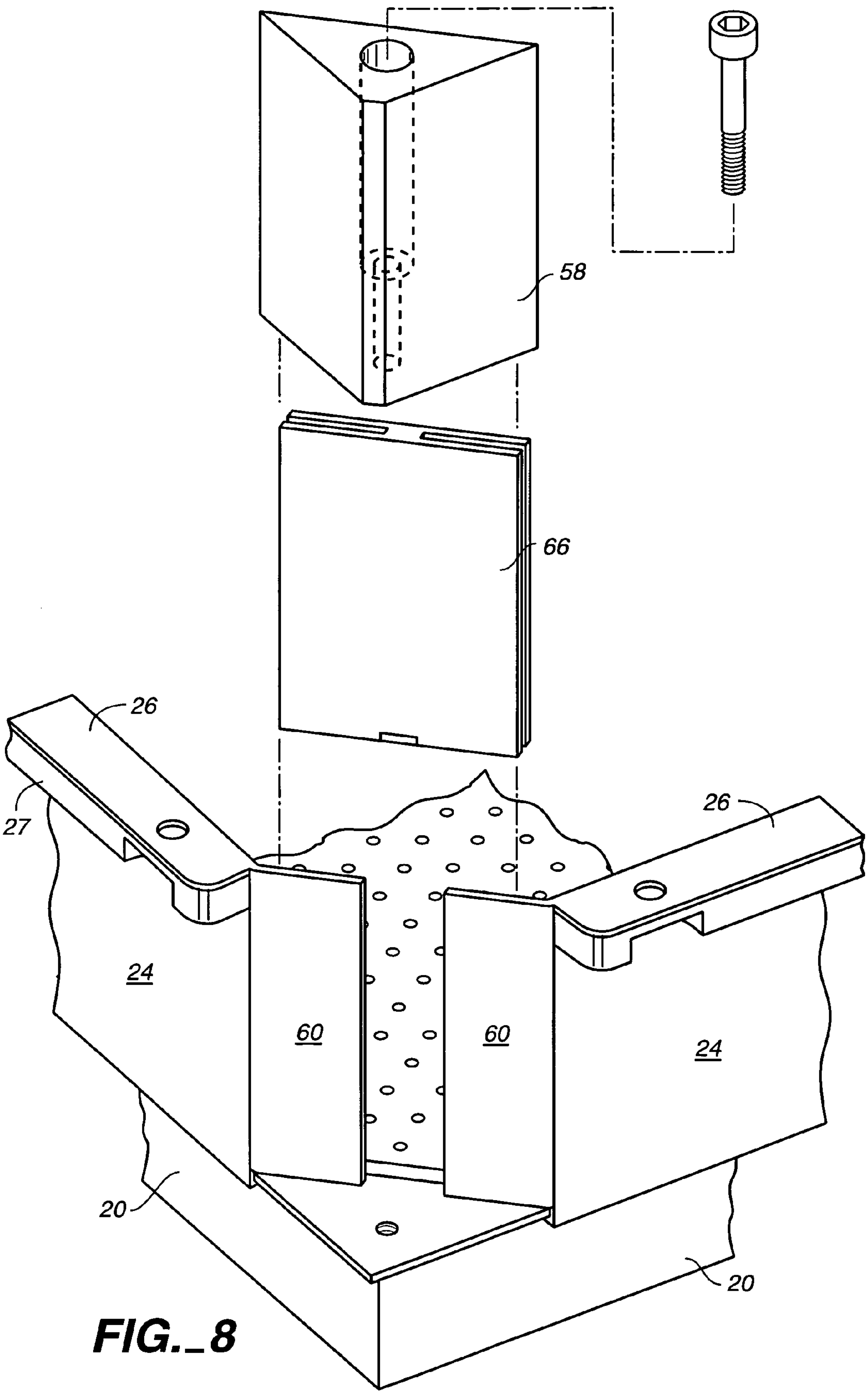
FIG._8

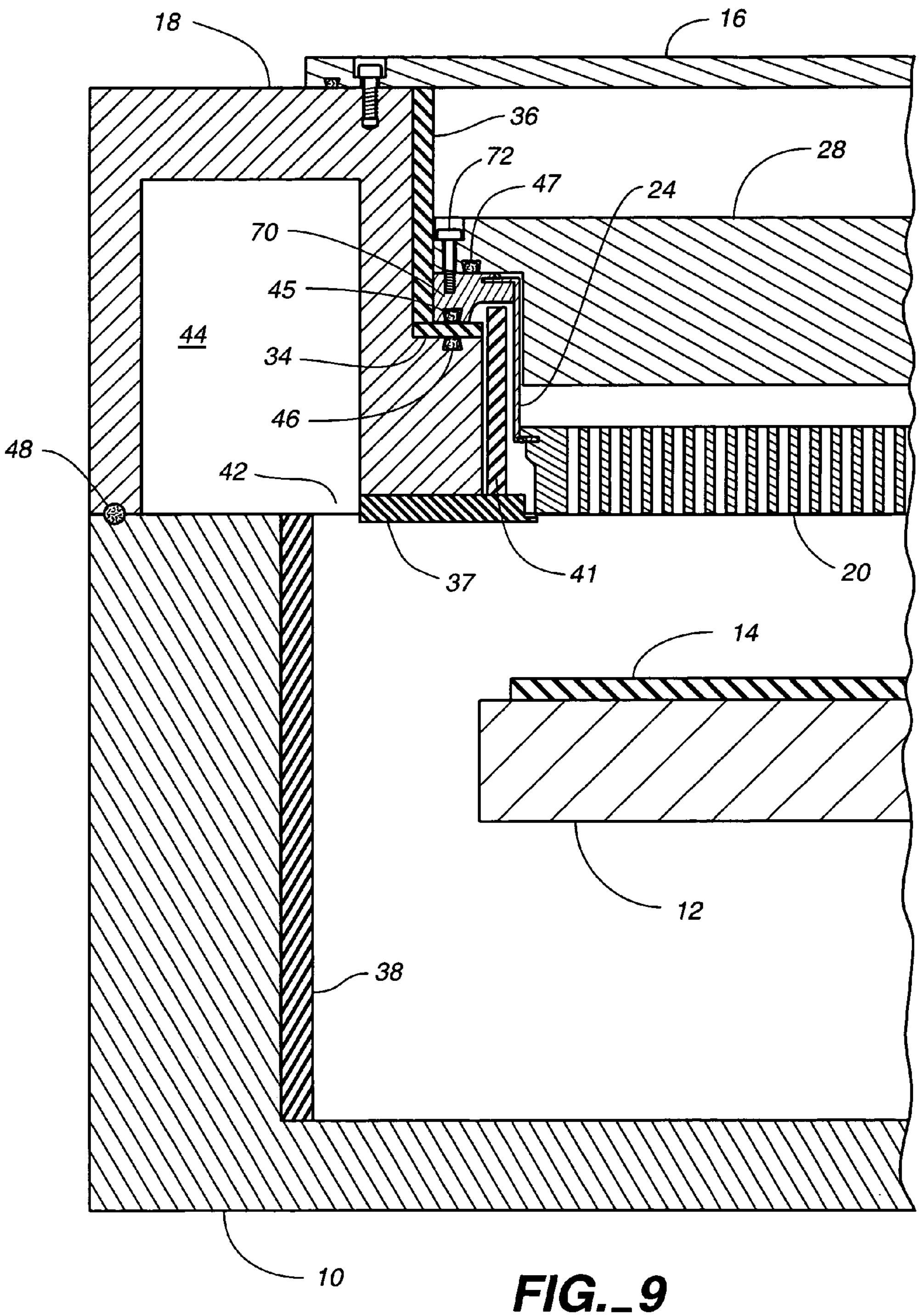
FIG._9

FIG._10
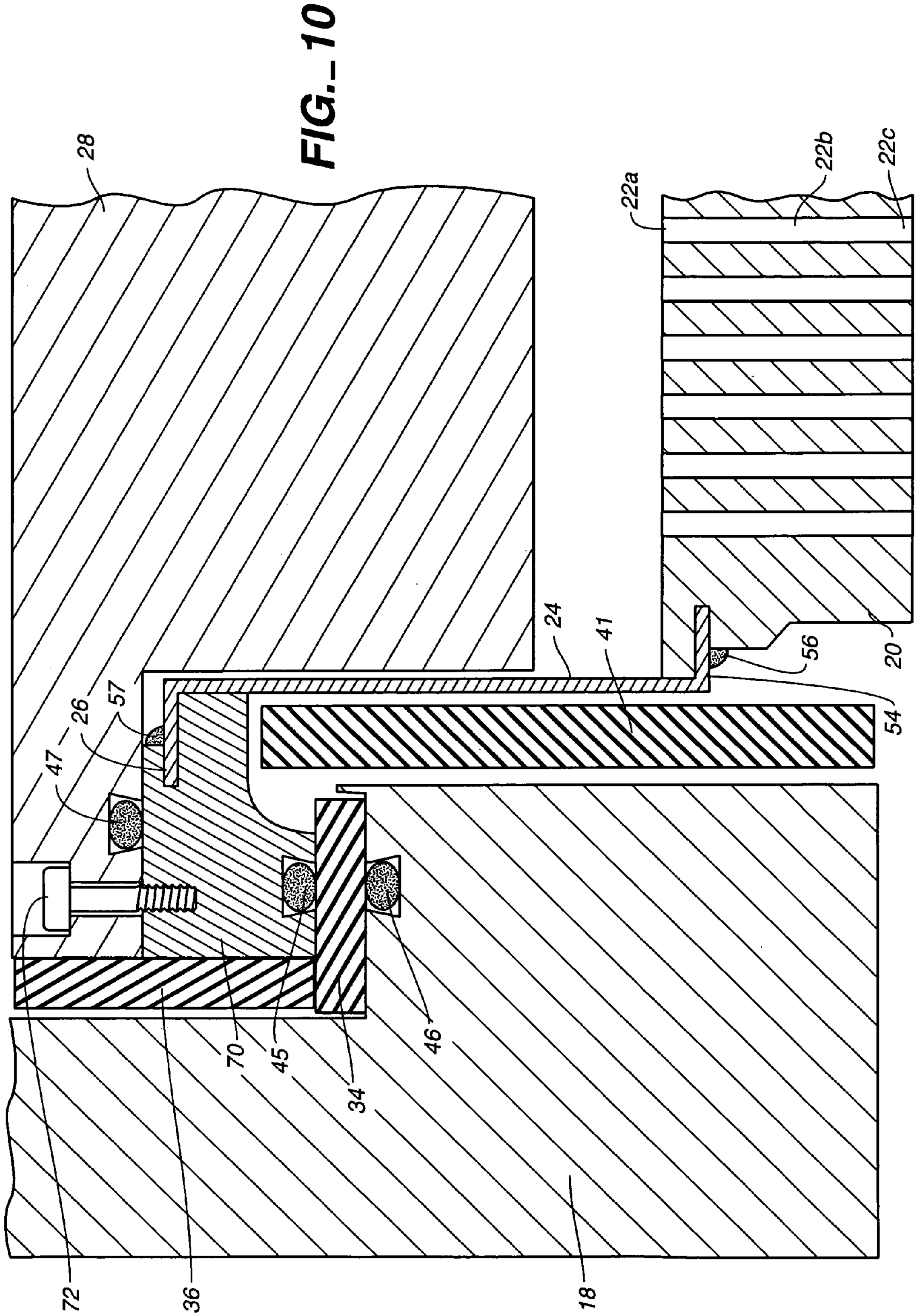

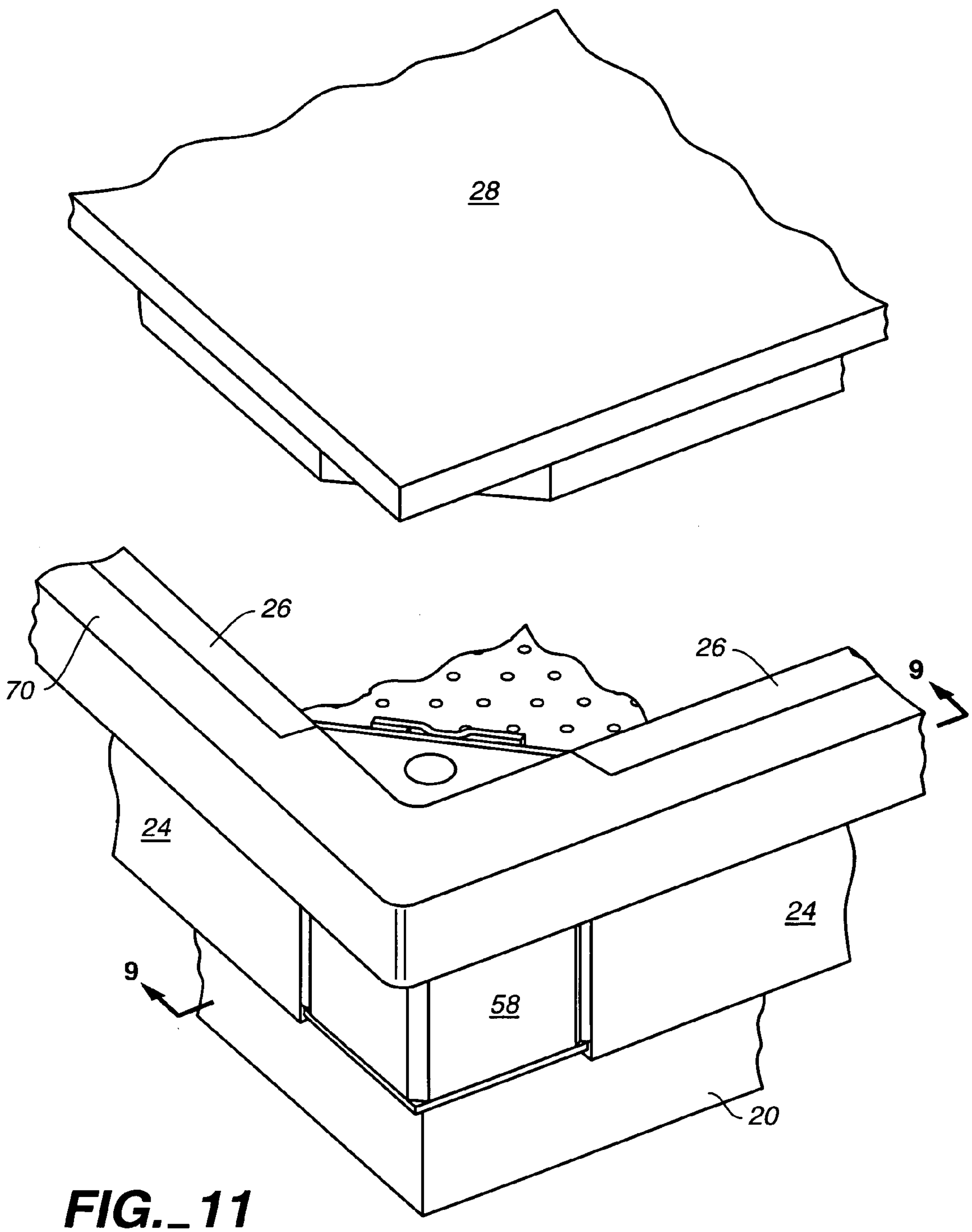
FIG._11

FIG._12
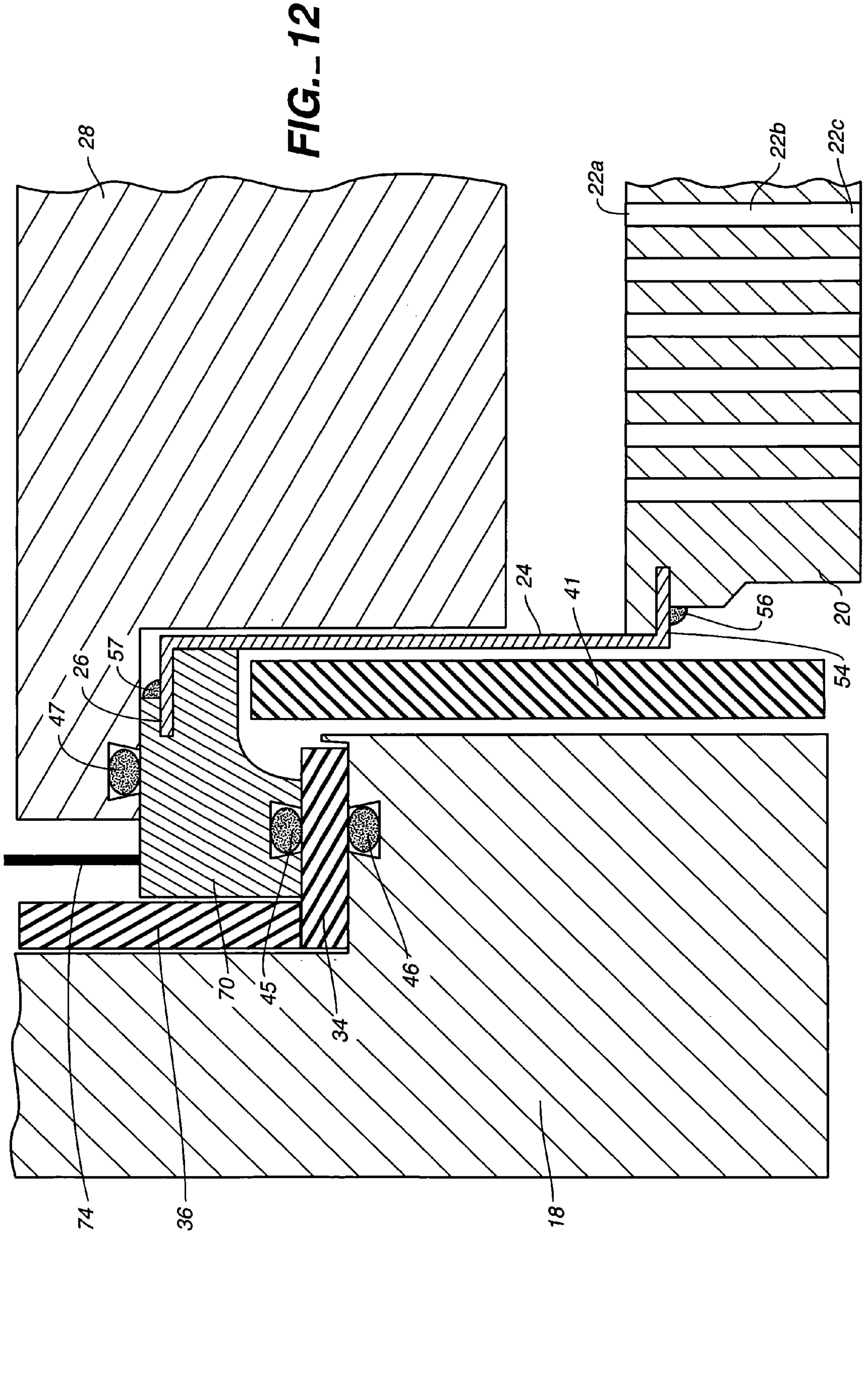

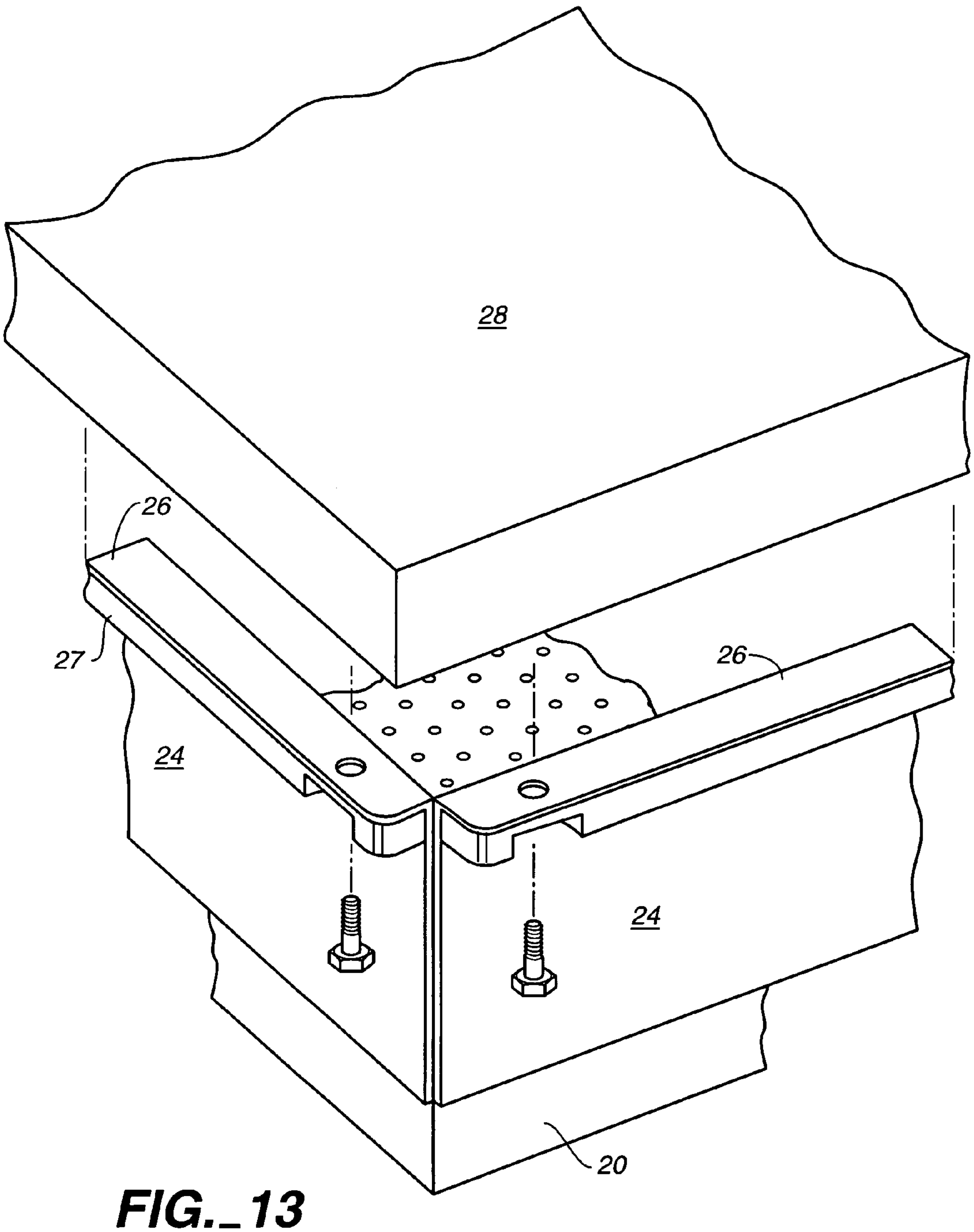
FIG._13

SUSPENDED GAS DISTRIBUTION PLATE

CROSS REFERENCE TO RELATED APPLICATIONS

This patent application is a divisional of application Ser. No. 10/293,544 filed Nov. 12, 2002, now U.S. Pat. No. 6,823,589 which is a divisional of Ser. No. 09/488,612 filed Jan. 20, 2000, now U.S. Pat. No. 6,477,980 issued Nov. 12, 2002.

FIELD OF THE INVENTION

The invention relates generally to gas distribution manifolds for supplying gas to a plasma chamber. More specifically, the invention relates to such a manifold having a perforated gas distribution plate suspended by flexible side walls which accommodate thermal expansion of the plate.

BACKGROUND OF THE INVENTION

Electronic devices, such as flat panel displays and integrated circuits, commonly are fabricated by a series of process steps in which layers are deposited on a substrate and the deposited material is etched into desired patterns. The process steps commonly include plasma enhanced chemical vapor deposition (CVD) processes and plasma etch processes.

Plasma processes require supplying a process gas mixture to a vacuum chamber called a plasma chamber, and then applying electrical or electromagnetic power to excite the process gas to a plasma state. The plasma decomposes the gas mixture into ion species that perform the desired deposition or etch process.

In capacitively excited CVD chambers, the plasma is excited by RF power applied between an anode electrode and a cathode electrode. Generally the substrate is mounted on a pedestal or susceptor that functions as the cathode electrode, and the anode electrode is mounted a short distance from, and parallel to, the substrate. Commonly the anode electrode also functions as a gas distribution plate for supplying the process gas mixture into the chamber. The anode electrode is perforated with hundreds or thousands of orifices through which the process gas mixture flows into the gap between the anode and cathode. The orifices are spaced across the surface of the gas distribution plate so as to maximize the spatial uniformity of the process gas mixture adjacent the substrate. Such a gas distribution plate, also called a diffuser plate or “shower head”, is described in commonly assigned U.S. Pat. No. 4,854,263 issued Aug. 8, 1989 to Chang et al.

Perforated gas distribution plates typically are rigidly mounted to the lid or upper wall of the plasma chamber. Rigid mounting has the disadvantage of not accommodating thermal expansion of the perforated plate as it acquires heat from the plasma. The consequent mechanical stresses on the plate can distort or crack the plate. Alleviating mechanical stress is most important with the larger distribution plates required to process larger workpieces, such as large flat panel displays. Therefore, a need exists for a gas distribution device that minimizes such thermally induced mechanical stresses.

Another shortcoming of conventional gas distribution plates is that they generally remain cool during the CVD process, hence they contribute to undesirable heat loss from the surface of the substrate. Specifically, conventional gas distribution plates generally are bolted directly to a chamber lid or side wall that has high thermal mass and high thermal conductivity, so that the lid or side wall functions as a heat sink drawing heat away from the distribution plate. Therefore, conventional designs typically maintain the gas distribution plate at an undesirably low temperature.

SUMMARY OF THE INVENTION

The invention is a gas inlet manifold for a plasma chamber. The manifold has a perforated gas distribution plate suspended by a flexible side wall which accommodates thermal expansion or contraction of the gas distribution plate. The invention is advantageous to avoid distortion or cracking of the gas distribution plate in response to such thermal expansion or contraction.

The invention is a method of suspending a gas distribution plate from a plurality of side wall segments separated by gaps. One aspect of the invention includes positioning a novel sealing cover that minimizes gas leakage through the gaps while permitting movement of the flexible side wall segments. In another aspect of the invention, each of two adjacent side wall segments has a side portion in which a bend is formed so that the side portions of the two adjacent side wall segments are coplanar.

In another aspect, the invention is facilitates operation of the perforated gas distribution plate at an elevated temperature. The gas distribution plate is suspended from the chamber wall by inlet manifold side walls. The inlet manifold side walls interpose substantial thermal impedance between the gas distribution plate and the chamber wall, thereby allowing the gas distribution plate to increase in temperature. This aspect of the invention is advantageous to help reduce heat loss from the exposed surface of the workpiece during operation of the chamber.

BRIEF DESCRIPTION OF THE DRAWINGS

FIG. 1 is a sectional, partially schematic side view of a plasma chamber that includes the gas inlet manifold of the present invention.

FIG. 2 is a partially exploded perspective view of a corner of the gas inlet manifold.

FIG. 3 is a transverse sectional view of a corner of the gas inlet manifold.

FIG. 4 is a vertical sectional view of one side of the gas inlet manifold.

FIG. 5 is a vertical sectional view of a corner of the gas inlet manifold.

FIG. 6 is an exploded view of the corner shown in FIG. 2.

FIG. 7 is a plan view of an alternative corner junction or coupler before it is folded.

FIG. 8 is an exploded view of a corner having the alternative coupler of FIG. 7.

FIG. 9 is a view similar to FIG. 4 of an alternative embodiment having a gas inlet manifold in which a portion of the top flange of the flexible side wall is exposed to atmospheric pressure.

FIG. 10 is a detail of FIG. 9.

FIG. 11 is a view similar to FIG. 2 of the alternative embodiment of FIG. 9.

FIG. 12 is a view similar to FIG. 10 showing an electrical cable connected directly to the top flange of the side wall of the gas inlet manifold.

FIG. 13 is a partially exploded perspective view of a corner of an alternative gas inlet manifold in which the flexible side walls abut at the corners and the corner couplers are omitted.

DETAILED DESCRIPTION OF THE PREFERRED EMBODIMENTS

Plasma Chamber Overview

FIG. 1 shows a plasma chamber that includes a gas inlet manifold 20–32, also called a gas distribution manifold or plenum, according to the present invention. The illustrated chamber is suitable for performing plasma-assisted processes such as chemical vapor deposition (CVD) or etching on a large substrate. It is especially suitable for performing CVD processes for fabricating the electronic circuitry of a flat panel display on a glass substrate.

The plasma chamber or vacuum chamber has a housing or wall 10, preferably composed of aluminum, that encircles the interior of the chamber. The chamber wall 10 provides the vacuum enclosure for the side, and much of the bottom, of the chamber interior. A metal pedestal or susceptor 12 functions as a cathode electrode and has a flat upper surface that supports a workpiece or substrate 14. Alternatively, the substrate need not directly contact the susceptor, but may be held slightly above the upper surface of the susceptor by, for example, a plurality of lift pins, not shown.

An external gas supply, not shown, delivers one or more process gases to the process chamber. Specifically, the chamber includes a gas inlet manifold or plenum 20–32 (described in detail below) that encloses a region referred to as the manifold interior. A gas line or conduit extending from the external gas supply to a gas inlet aperture or orifice 30 in an outer wall or back wall 28 of the gas inlet manifold supplies the process gases into the manifold interior. The gases then flow out of the manifold through hundreds or thousands of orifices 22 in a gas distribution plate or diffuser plate 20 so as to enter the region of the chamber interior between the gas distribution plate and the susceptor 12.

A conventional vacuum pump, not shown, maintains a desired level of vacuum within the chamber and exhausts the process gases and reaction products from the chamber through an annular exhaust slit 42, then into annular exhaust plenum 44, and then through an exhaust channel, not shown, to the pump.

The gas distribution plate or diffuser plate 20 is composed of an electrically conductive material, preferably aluminum, so that it can function as an anode electrode. An RF power supply, not shown, is connected between the gas distribution plate and the electrically grounded chamber components. A typical frequency for the RF power supply is 13 MHz. Because it is RF hot, the gas distribution plate 20 is electrically insulated from the lid by annular dielectric spacers 34, 35, 36. The chamber side and bottom wall 10 and the lid 18 are connected to electrical ground. The susceptor or workpiece support pedestal 12 typically is grounded also, but it optionally can be connected to a second RF power supply, commonly called the bias power supply.

The RF power applied between the cathode electrode (the susceptor 12) and the anode electrode (the gas distribution plate 20) produces an electromagnetic field in the region between the two electrodes that excites the gases in that region to a plasma state. The plasma produces reactive species from the process gas mixture that react with exposed material on the workpiece to perform the desired deposition or etch process.

To concentrate the plasma in the region of the chamber between the workpiece 14 and the gas distribution plate 20, other metal surfaces in the chamber that are near the distribution plate preferably are covered with dielectric liners. Specifically, a dielectric liner 37 is bolted to the underside of the lid 18, and dielectric liner 38 covers the chamber side wall 10. To prevent plasma formation, and to minimize RF power conduction, in the annular gap between the gas inlet manifold and the lid, a dielectric liner 41 occupies that gap.

A removable lid 18 rests atop the chamber side wall 10 so that the lid functions as an additional portion of the chamber wall. The gas inlet manifold 20–32 rests on an annular, inwardly extending shelf of the lid. A cover 16 is clamped to the top of the lid 18. The only purpose of the cover is to protect human personnel from accidental contact with the portions of the gas inlet manifold that are RF hot, as described below.

The chamber components should be composed of materials that will not contaminate the semiconductor fabrication processes to be performed in the chamber and that will resist corrosion by the process gases. Aluminum is our preferred material for all of the components other than the dielectric spacers and liners 34–41 and the O-rings 45–48.

All portions of the plasma chamber other than the gas inlet manifold are conventional. The design and operation of conventional plasma CVD and etch chambers are described in the following commonly-assigned U.S. patents, the entire content of each of which is hereby incorporated by reference in this patent specification: U.S. Pat. No. 5,844,205 issued Dec. 1,1998 to White et al.; and U.S. Pat. No. 4,854,263 issued Aug. 8, 1989 to Chang et al.

Gas Inlet Manifold

FIGS. 2–4 show the gas inlet manifold or plenum in more detail. The gas inlet manifold has an interior region that is bounded on the bottom by the gas distribution plate or diffuser plate 20, on the sides by the flexible side wall or suspension 24, and on the top by the outer wall or back wall 28. (The triangular corner post 58 shown in FIGS. 2 and 3 will be described later.)

In the illustrated embodiments, the gas distribution plate 20 is an aluminum plate that is 3 cm thick. Preferably it should be thick enough so that it is not significantly deformed under atmospheric pressure when a vacuum is created within the chamber.

In our novel gas inlet manifold design, the gas distribution plate 20 is suspended by a thin, flexible side wall or suspension 24, so that the suspension supports the entire weight of the gas distribution plate. As explained in the section below entitled "Accommodating Thermally Induced Mechanical Expansion/Contraction", the suspension is flexible to minimize stress on the gas distribution plate in response to its thermal expansion and contraction. The upper end of the flexible side wall has an upper lip 26 that is directly or indirectly mounted to and supported by the chamber wall 10. By "indirect" mounting and support, we mean that the upper end of the suspension may be supported by the chamber wall through intermediate components that are interposed between the upper lip 26 and the chamber wall 10, such as the back wall 28 and the lid 18 in the embodiment of FIG. 1.

The back wall 28 of the gas inlet manifold is mounted so as to abut the upper end 26 of the suspension, so that the back wall forms the upper boundary or enclosure of the interior region of the gas inlet manifold.

In the illustrated embodiments having a rectangular gas distribution plate 20, the flexible side wall or suspension 24 preferably consists of four distinct pieces of thin, flexible sheet metal, one on each of the four sides of the gas distribution plate. The four pieces or sides of the side wall or suspension 24 collectively encircle the interior of the gas inlet manifold.

The orifices 22 in the gas distribution plate should have a diameter smaller than the width of the plasma dark space in order to prevent plasma within the plasma chamber from entering the region enclosed by the gas inlet manifold, i.e., the region between the gas distribution plate 20 and the back wall 28. The width of the dark space, and therefore the optimum diameter of the orifices, depends on chamber pressure and other parameters of the specific semiconductor fabrication processes desired to be performed in the chamber. Alternatively, to perform plasma processes using reagent gases that are especially difficult to dissociate, it may be desirable to employ orifices having a narrow inlet and a wider, flared outlet as described in the above-referenced U.S. Pat. No. 4,854,263 to Chang et al.

Preferably the gas inlet manifold also includes a gas inlet deflector consisting of a circular disc 32 having a diameter slightly greater than that of the gas inlet orifice 30 and suspended below the orifice by posts, not shown. The deflector blocks gases from flowing in a straight path from the gas inlet 30 to the directly adjacent holes 22 in the center of the gas distribution plate, thereby helping to equalize the respective gas flow rates through the center and periphery of the gas distribution plate.

Embodiment #1—Back Wall Provides Vacuum Seal

In the embodiments shown in FIGS. 1–8, the upper surface of the back wall 28 is the only component of the gas inlet manifold that is exposed to the ambient atmospheric pressure, hence the back wall is the only component of the gas inlet manifold that requires a vacuum seal. Specifically, a vacuum seal between the chamber interior and the ambient atmosphere outside the chamber is provided by a first vacuum sealing material 45 between the back wall 28 and the dielectric spacer 34, and by a second vacuum sealing material 46 between the dielectric 34 and a surface of the chamber wall. In the illustrated embodiments, the latter surface is the surface of the lid 18 on which the dielectric rests. Because the illustrated embodiments include a removable lid 18, an additional vacuum sealing material 48 is required between the lid and the chamber side wall 10. Sealing materials 45, 46 and 48 preferably are O-rings.

In this embodiment, a gas tight seal is not required between the back wall 28 and the upper lip 26 of the flexible side walls 24. The only consequence of a gas leak at this junction would be that a small amount of process gas would enter the chamber interior through the leak rather than through the orifices 22 in the gas distribution plate 20. Consequently, in the illustrated preferred embodiment there is no O-ring between the back wall 28 and the upper lip 26 of the flexible side wall. The upper lip 26 is simply bolted to the back wall 28 by a plurality of bolts 72 spaced around the rim of the back wall. (See FIG. 4.)

Because the inlet manifold side walls 24 are metal, they can provide good RF electrical contact between the gas distribution plate 20 and the back wall 28. Therefore, the electrical cable that connects the gas distribution plate to the RF power supply can be attached directly to the outer surface of the back wall rather than to the distribution plate. Attaching the RF cable directly to the gas distribution plate would be undesirable because it would expose the RF connector to the potentially corrosive process gas mixture. The bolts 72 help ensure good RF electrical contact between the upper lip 26 of the flexible side walls 24, and the welds 56 help ensure good RF electrical contact between the lower lip 54 of the side walls and the gas distribution plate.

Embodiment #2—Upper Flange of Side Wall Also Provides Vacuum Seal

In an alternative embodiment shown in FIGS. 9–11, the upper flange 70 of the flexible side wall or suspension 24 of the gas inlet manifold is partially exposed to the external ambient atmosphere. This contrasts with the embodiments of FIGS. 1–8 in which the entire suspension 24, including the upper lip 26, is completely enclosed by the perimeter of the back wall 28 of the gas inlet manifold. Consequently, in the embodiment of FIGS. 9–11, the upper flange 70 of the flexible side wall must contribute to the vacuum seal between the chamber interior and the external ambient atmosphere, which requires one more O-ring than the previous embodiments.

As in the previous embodiments, two O-rings 45, 46 or other sealing material are required on either side of the dielectric spacer 34, i.e., a first O-ring 45 between the dielectric and the upper flange 70 of the flexible side wall 24, and a second O-ring 46 between the dielectric and the lid 18. Unlike the previous embodiments, the present embodiment additionally requires a third O-ring 47 or other sealing material between the upper flange 70 and the back wall 28.

In order to effect a vacuum seal between the upper flange 70 and the back wall 28, the portion of the upper flange 70 in contact with the third O-ring 47 must be continuous and uninterrupted around the complete circle of the O-ring (see FIG. 11), in contrast with the previous embodiments in which the upper lip 26 did not extend around any of the four corners of the gas inlet manifold.

There is no need for the flexible side wall or suspension 24 to be continuous and uninterrupted, since it is not part of the vacuum seal between the chamber interior and the external ambient atmosphere. Therefore, it can be four distinct pieces as in the previous embodiments.

A plurality of bolts 72 spaced around the rim of the back wall 28 attach the upper flange 70 of the suspension 24 to the back wall.

The upper flange 70 preferably is shaped as a rectangular frame with an open center. It can be fabricated by cutting away or stamping the open center from a rectangular plate. The upper flange 70 of this embodiment replaces the four reinforcing bars 27 of the previous embodiments. The upper flange 70 preferably should have a smooth, flat upper surface abutting the back wall 28. To prevent the upper lip 26 of the suspension 24 from projecting above the plane of this upper surface, the upper lip 26 preferably is attached (e.g., by weld 57) to the upper flange 70 at a shelf recessed below the upper surface of the flange.

As in the previously discussed embodiments of FIGS. 1–8, in our preferred embodiment of FIGS. 9–11 we prefer to connect the RF cable directly to the upper surface of the back wall 28. The bolts 72 press the upper flange 70 of the suspension 24 against the back wall 28 and thereby help ensure good RF electrical contact between the back wall and the suspension. An important advantage of the present embodiment over the embodiments of FIGS. 1–8 is that the bolts 72 can be located radially outward of the O-ring 47. Consequently, the O-ring 47 protects the bolts 72—and, most importantly, the adjacent areas of electrical contact between the back wall 28 and the upper flange 70 of the suspension—from exposure to the corrosive process gases and plasma within the chamber that eventually could degrade the electrical contact.

Unlike the embodiments of FIGS. 1–8, the embodiment of FIGS. 9–11 leaves the radially outer portion of the upper flange 70 uncovered by the back wall 28. Therefore, this embodiment permits the electrical cable 74 from the RF power supply to be connected directly to the upper flange 70 at an area radially outward of the perimeter of the back wall 28, as shown in FIG. 12. In this alternative implementation, because the electrical cable is not connected to the back wall, there is no need to ensure a low impedance electrical contact between the side wall 24 and the back wall. Preferably, in the FIG. 12 embodiment the upper flange 70 is mechanically mounted to the back wall 28 using the same bolts 72 as in the embodiment of FIGS. 9–11, although the bolts are not shown in FIG. 12.

Accommodating Thermally Induced Mechanical Expansion/Contraction

A novel and valuable function of the flexible side wall or suspension 24 of our inlet manifold is that it minimizes mechanical stresses that could distort or crack the gas distribution plate or diffuser 20 when the diffuser undergoes thermal expansion and contraction. (The gas distribution plate is referred to as the diffuser for brevity.) The amount by which the diffuser 20 expands is proportional to both the size of the diffuser and its temperature. Therefore, alleviating mechanical stress is most important with the larger diffusers required to process larger workpieces, such as large flat panel displays. In our prototype the width of the diffuser was 300 mm×350 mm. For reasons described below, it is desirable to maintain the diffuser at 250° to 325° C. during the operation of a CVD process. We find that at such temperatures an aluminum diffuser expands by about one percent in each dimension, i.e., the width of our illustrative 300 mm×350 mm diffuser expands by about 3 mm.

When the width of the diffuser 20 expands and contracts in response to temperature changes during normal operation of the chamber, it forces the flexible side wall or suspension 24 to bend by some amount. The side wall should be flexible enough to bend by that amount without substantial force. In particular, the bending force between the diffuser and the side wall should be low enough to avoid cracking or distorting the diffuser. More specifically, the bending force should be low enough to prevent distorting the shape of the diffuser by more than 0.1 mm=100 microns, more preferably by no more than 0.025 mm=25 microns, and most preferably by no more than 0.01 mm=10 microns. It is especially important to avoid more than this amount of distortion of the flatness or contour of the surface of the diffuser that faces the substrate 14.

In the successfully tested embodiment of FIG. 1, our inlet manifold suspension or side wall 24 was sheet aluminum having a thickness of 1 mm and a height of 50 mm.

Although it is simplest to construct the flexible side wall or suspension 24 entirely of flexible sheet aluminum so that the side wall is flexible along its entire height, this is not required. It suffices for the suspension to include at least one flexible portion somewhere between the upper end 26 and the lower end 54.

Design parameters that reduce the bending force are: (1) selecting a more flexible material for the flexible portion of the suspension; (2) decreasing the thickness of the flexible portion; and (3) increasing the length (i.e., height) of the flexible portion. By length or height we mean the dimension of the flexible portion of the side wall along the direction perpendicular to the plane of the diffuser.

As stated above, in response to heating during operation of the chamber, our 300 mm×350 mm diffuser expanded in width by one percent or 3 mm. Therefore, each of the four side walls was laterally deflected by half this amount, which is 1.5 mm. The angle at which each side wall bends is the lateral deflection of the side wall divided by the height of the side wall, which in this example is 1.5 mm/ 50 mm=0.03 radians=1.7 degrees. Therefore, in our example, the side wall or suspension 24 should be flexible enough (i.e., sufficiently thin and long) to bend at least 1.7 degrees without exerting substantial force on the diffuser. As stated above, such bending force preferably should not distort the shape of the diffuser by more than 10 or 25 microns.

In the illustrated preferred embodiment, the substrate 14 and the diffuser 20 are rectangular. Although the flexible side wall 24 can be a single, unbroken annulus with a rectangular cross section, an unbroken design is not preferred because thermally induced mechanical expansion and contraction of the diffuser would produce excessive stress at the corners of the side wall 24. Our preferred design for avoiding such stress is to divide the flexible side wall into four segments or pieces, one for each side of the rectangular diffuser, and to provide at each corner a novel expansion joint that allows only a negligible amount of gas to leak at the joint.

Specifically, the inlet manifold side wall or suspension 24 preferably consists of four distinct pieces of thin, flexible sheet aluminum respectively located at the four sides of the rectangular inlet manifold. (See FIGS. 2 and 3.) Each of the four sides 24 preferably is formed from a flat, rectangular piece of sheet metal whose upper end is bent 90° to form an outwardly extending upper lip 26, and whose lower end is bent 90° to form an inwardly extending lower flange 54. (See FIG. 4.) The lower flange preferably is attached to the diffuser 20 by being inserted in a groove in the diffuser and then reinforced by a weld bead 54.

Each of the four lips 26 is reinforced by a rigid bar 27, preferably a 5 mm thick aluminum bar. Each reinforcing bar 27 is bolted to the underside of the back wall 28, and the corresponding upper lip 26 is sandwiched between the reinforcing bar and the back wall, thereby clamping the upper lip to the back wall.

To attach the diffuser to the inlet manifold side wall pieces 24, a groove extends almost the entire width of each of the four sides of the diffuser (FIG. 2). Each of the four side wall pieces 24 has a right angle bend at its lower end, and the inwardly extending portion 54 below the bend constitutes a lower mounting flange that fits into the corresponding groove of the diffuser (FIG. 4). One or more weld beads 56 is welded to the lower mounting flange 54 and the diffuser 20 to secure them together.

Since the preferred embodiment implements the inlet manifold side wall 24 as four separate segments or pieces, two adjacent side wall pieces will meet near each of the four corners of the diffuser. A junction or seal between the edges of adjacent side wall pieces 24 should be provided at each corner so that excessive process gas does not leak from the inlet manifold into the chamber at the junction. To preserve the benefit of our flexible inlet manifold side wall in accommodating thermal expansion of the diffuser, the junction should accommodate flexing of the inlet manifold side wall as the diffuser expands and contracts.

FIGS. 2, 3 and 6 show our preferred junction at each of the four corners of the diffuser. Both ends 60 of each of the four side wall pieces 24 are bent inward at a 45 degree angle so that, at a given corner, the respective ends of the two adjacent side wall pieces 24 are coplanar. A moderately gas-tight seal between the adjacent ends 60 is accomplished by a slotted cover or coupler 62, 64 that slips over the two ends 60. The coupler is fabricated by welding together two pieces of sheet aluminum along a vertical center seam, and bending one coupler piece 62 so as to create a slot between it and the other coupler piece 64. The slotted coupler is installed by slipping it over the two ends 60 so that the seam of the coupler is approximately centered in the gap between the two ends 60, and so that each end 60 fits snugly in a corresponding one of the two slots of the coupler. The slot is sized to fit around the end 60 with sufficient snugness so that it permits an amount of gas leakage from the inlet manifold to the chamber that is no more than a small fraction of the intended gas flow through the perforations 22. Nevertheless, the slot is sized large enough to permit radial movement of the ends 60 as the diffuser expands and contracts.

FIGS. 7 and 8 show an alternative design for the slotted cover or coupler consisting of a single, rectangular piece of sheet metal 66. A pair of rectangular notches is cut out as shown in FIG. 7 so as to leave only a thin bridge 68 between two halves of the coupler 66. The coupler 66 is folded in half at the bridge as shown in FIG. 8. The width W of the bridge 68 is narrow enough to slide between the two ends 60 of the two inlet manifold side walls that meet at a corner. The slotted coupler 66 is installed in the same manner as the previously described coupler 62, 64: by sliding the coupler 66 over the two ends 60. The length L of the bridge 68 determines the gap between the two halves of the coupler 66 when it is folded as shown in FIG. 8. This gap should be large enough to permit movement of the ends 60 as the inlet manifold side wall flexes in response to expansion and contraction of the diffuser, but it should be small enough so that the two halves of the slotted coupler 66 fit snugly around the ends 60 so as to minimize gas leakage as described in the preceding paragraph.

Our preferred embodiment additionally includes in each of the four corners of the gas inlet manifold a stationary corner support post 58 having a triangular cross section as shown in FIGS. 2, 3, 5 and 6. The corner support post is bolted to the diffuser 20 as shown in FIGS. 5 and 6, and it is spaced outward from the slotted coupler 62, 64 so as to not interfere with movement of the slotted coupler as the diffuser expands and contracts. The corner support post has no function during operation of the plasma chamber, and it therefore can be omitted. Its only function is to prevent the thin side walls 24 from collapsing when the gas inlet manifold assembly 20–32 is stored outside the plasma chamber, for example when the manifold assembly is stored as a spare part, or when it is removed from the plasma chamber to permit maintenance of the chamber.

In an alternative design shown in FIG. 13, the four corner covers or couplers 60–66 can be omitted simply by extending each of the four pieces of the flexible side walls 24 so that they abut at the four corners of the diffuser. This simplified design may produce more leakage of process gas at the corners, but in many applications the amount of leakage may be so small as to not significantly affect the plasma process being performed on the workpiece.

In a chamber intended to process a circular workpiece 14 such as a silicon wafer, the diffuser 20 preferably should be circular in cross section, rather than rectangular as in the preceding examples. In that case, the flexible suspension or side wall 24 of the gas inlet manifold could be a single, unbroken piece having an annular shape. Alternatively, the flexibility of the suspension could be increased by dividing it into any number of axially extending segments separated by small axially extending gaps, similar to the four segments of the rectangular side wall in the previously discussed embodiments.

While thermal expansion of the diffuser is not a severe problem in the chambers most commonly used today for processing 200 mm diameter silicon wafers, thermal expansion will become more significant as the industry moves to larger diameter wafers, and hence larger diameter diffusers. Therefore, this is an important prospective application of the invention.

Thermal Isolation

To ensure a reliable vacuum seal between the chamber interior and the external atmosphere, it is important to protect the O-rings 45–48 from excessive temperature. Low cost O-rings (e.g., composed of Viton elastomer) typically are rated by their manufacturers at 250° C. or less, and some experts believe such O-rings should be maintained at or below 100° C. to maximize their reliability.

The O-rings 46 and 48 directly contact the lid 18, and O-ring 47 directly contacts the back wall 28 of the gas inlet manifold, hence the temperatures of these O-rings are expected to be about the same as the respective temperatures of the lid and back wall. In the first embodiment, the O-ring 45 directly contacts the back wall, whereas in the second embodiment (FIGS. 9–11) the O-ring 45 directly contacts the upper flange 70 of the suspension 24. Because the upper flange preferably is mounted in good thermal contact with the back wall, the O-ring 45 in this embodiment is expected to be only slightly hotter than the other O-rings.

We find that simple exposure to the ambient atmosphere suffices to maintain the lid 18 and chamber wall 10 at temperatures of 100° to 140° C. The inlet manifold back wall 28 generally is cooler because it has no direct exposure to heat radiation from the plasma within the chamber. Therefore, we expect the temperatures of the O-rings 45–48 will not exceed 140° C. This temperature is low enough that we do not believe any additional cooling, such as water cooling, is required.

Optionally, however, the chamber side wall 10 can be further cooled by surrounding it with a water jacket, not shown, through which cool water can be pumped. Similarly, the lid 18, back wall 28 and cover 16 can be cooled by pumping the same water through a sealed water jacket (not shown) mounted on the upper surface of the back wall 28, below the cover 16. Such water cooling can prevent the temperatures of the O-rings 45–48 from exceeding 100° C.

Since the back wall 28 of the gas inlet manifold is RF powered, a dielectric should be interposed between the water jacket and the back wall. A thicker dielectric can be selected if it is desired to increase the temperature differential between the water jacket and the back wall. This may be useful in applications in which it is desired to maintain the back wall at a temperature substantially higher than the temperature of the water, such as a temperature over 100° C. Maintaining the back wall at such a high temperature would help elevate the temperature of the gas distribution plate, which can be advantageous for reasons explained in the next paragraph.

While low temperature is important for the O-rings, it is undesirable for the gas distribution plate or diffuser 20. Elevating the temperature of the gas distribution plate to 250° to 325° C. is advantageous to reduce heat loss from the surface of the substrate 14. Also, if it is desired to use a conventional in situ plasma process for cleaning residue from the interior of the chamber, the cleaning of the gas distribution plate is accelerated if the temperature of the gas distribution plate is elevated.

In conventional designs, the gas distribution plate is bolted directly to a chamber lid or side wall that has high thermal mass and high thermal conductivity, so that the lid or side wall functions as a heat sink drawing heat away from the distribution plate. In contrast, our novel inlet manifold side wall 24 can thermally isolate the gas distribution plate by providing thermal resistance between the gas distribution plate and the other chamber components such as the lid 18 and chamber wall 10. Therefore, our gas distribution plate can operate at a higher temperature than conventional designs.

In our preferred design for providing the desired thermal isolation of the gas distribution plate 20, our inlet manifold side wall 24 (or a portion thereof) is sufficiently thin, and has sufficient length or height, so that the thermal resistance of the side wall 24 (or such portion) is large enough to provide a substantial temperature difference between the gas distribution plate and the chamber components to which it is mounted, i.e., the back wall 28, the chamber lid 18, the chamber side wall 10, and the O-rings 45–47. By length or height we mean a dimension along the direction perpendicular to the plane of the gas distribution plate. In the successfully tested embodiment of FIG. 1, the inlet manifold side wall is sheet aluminum having a thickness of 1 mm and a height of 5 cm.

Our preferred temperature for the gas distribution plate 20 while performing a plasma CVD process is at least 200° C., preferably 250° to 325° C., and most preferably about 300° C. Our inlet manifold side wall 24 has sufficient thermal resistance to allow the gas distribution plate to reach such temperatures while the outer chamber components do not exceed 100° to 140° C. The chamber wall 10, lid 18, and inlet manifold back wall 28 can be considered to function as heat sinks to maintain the O-rings 45–48 at a sufficiently low temperature.

If the temperature is 300° C. at the gas distribution plate 20 during plasma processing and is 140° C. at the back wall 28 and O-rings 45–48, then the temperature differential across the inlet manifold side wall 24 is about 160° C. Our invention contemplates that the side wall thickness and height preferably should be sufficiently small and large, respectively, so that such temperature differential is at least 100° C. after the chamber components reach their normal operating temperatures during plasma processing.

In an alternative design approach, thermal isolation of the gas distribution plate 20 can be achieved by increasing the thermal resistance of one or both of the following two contact areas: (1) the area of contact between the suspension and the gas distribution plate, and (2) the area of contact between the suspension and other chamber components that are thermally coupled to the chamber wall.

One implementation of this approach is to reduce the surface area of at least one of these two contact areas. For example, the thermal resistance between the suspension and the gas distribution plate can be increased by reducing the surface area covered by the weld beads 56 between the gas distribution plate and the lower flange 54 of the suspension (FIGS. 4 and 10). As an alternative example, in the embodiments of FIGS. 9–12, the thermal resistance between the suspension and the other chamber components (lid 18 and back wall 28) can be increased by reducing the surface area covered by the weld beads 57 between the upper lip 26 and the flange 70 of the suspension. In either example, a possible implementation would be to apply only six or eight weld beads 56 or 57 that are each only one-half inch in width along the circumference of the suspension. Since the weld beads also conduct RF power to the gas distribution plate, they should be uniformly spaced around the circumference of the suspension 24 to ensure uniform RF power distribution.

What is claimed is:

1. A method of mounting a gas distribution plate, comprising the steps of:

providing a gas distribution plate perforated by a number of gas outlet orifices;

providing a suspension comprising a plurality of side wall segments including a first side wall segment and a second side wall segment, wherein each side wall segment includes a first end, a second end, and an edge extending between the first end and the second end of that side wall segment;

attaching the first end of each side wall segment to the gas distribution plate so that the edge of the first side wall segment and the edge of the second side wall segment are adjacent and are separated by a gap;

providing a cover having an inner member and an outer member joined together along an elongated junction that bisects both the inner member and the outer member; and positioning the cover so that the junction of the cover is within said gap and so that portions of the first and second segments of the suspension are between the inner and outer members of the cover.

2. A method according to claim 1, wherein the positioning step comprises:

positioning the inner and outer members of the cover sufficiently close to each other and to the first and second side wall segments so as to impede gas from flowing through said gap.

3. A method of mounting a gas distribution plate, comprising the steps of:

providing a gas distribution plate perforated by a number of gas outlet orifices;

providing a suspension comprising a plurality of side wall segments including a first side wall segment and a second side wall segment, wherein each side wall segment includes a first end, a second end, and an edge extending between the first end and the second end of that side wall segment;

attaching the first end of each side wall segment to the gas distribution plate so that the edge of the first side wall segment and the edge of the second side wall segment are adjacent and are separated by a gap;

providing a cover having first and second parallel members joined by a transverse member; and positioning the cover so that said gap is between the first and second parallel members of the cover, so that each of the two parallel members straddles the gap, and so that a portion of the first side wall segment and a portion of the second side wall segment are between the two parallel members.

4. A method according to claim 3, wherein the positioning step comprises:

positioning the two parallel members of the cover sufficiently close to each other and to the first and second side wall segments so as to impede gas from flowing through said gap.

5. A method of suspending a gas distribution plate within a plasma chamber, comprising the steps of:

providing a chamber wall enclosing a chamber interior, wherein the chamber wall includes a back wall perforated by a gas inlet orifice;

mounting within the chamber interior a susceptor for supporting a workpiece;

positioning a gas distribution plate between the back wall and the susceptor, wherein the gas distribution plate is perforated by a number of gas outlet orifices;

providing a suspension comprising a plurality of side wall segments including a first side wall segment and a second side wall segment, wherein each side wall segment includes a first end, a second end, and an edge extending between the first end and the second end of that side wall segment;

attaching the first end of each side wall segment to the gas distribution plate so that the edge of the first side wall segment and the edge of the second side wall segment are adjacent and are separated by a gap;

attaching the second end of each side wall segment to the back wall;

providing a cover having an inner member and an outer member joined together along an elongated junction that bisects both the inner member and the outer member; and positioning the cover so that the junction of the cover is within said gap and so that portions of the first and second segments of the suspension are between the inner and outer members of the cover.

6. A method according to claim 5, wherein the positioning step comprises:

positioning the inner and outer members of the cover sufficiently close to each other and to the first and second side wall segments so as to impede gas from flowing through said gap.

7. A method of suspending a gas distribution plate within a plasma chamber, comprising the steps of:

providing a chamber wall enclosing a chamber interior, wherein the chamber wall includes a back wall perforated by a gas inlet orifice;

mounting within the chamber interior a susceptor for supporting a workpiece;

positioning a gas distribution plate between the back wall and the susceptor, wherein the gas distribution plate is perforated by a number of gas outlet orifices;

providing a suspension comprising a plurality of side wall segments including a first side wall segment and a second side wall segment, wherein each side wall segment includes a first end, a second end, and an edge extending between the first end and the second end of that side wall segment;

attaching the first end of each side wall segment to the gas distribution plate so that the edge of the first side wall segment and the edge of the second side wall segment are adjacent and are separated by a gap;

attaching the second end of each side wall segment to the back wall;

providing a cover having first and second parallel members joined by a transverse member; and positioning the cover so that said gap is between the first and second parallel members of the cover, so that each of the two parallel members straddles the gap, and so that a portion of the first side wall segment and a portion of the second side wall segment are between the two parallel members.

8. A method according to claim 7, wherein the positioning step comprises:

positioning the two parallel members of the cover sufficiently close to each other and to the first and second side wall segments so as to impede gas from flowing through said gap.

9. A method of mounting a gas distribution plate, comprising the steps of:

providing a gas distribution plate perforated by a number of gas outlet orifices;

providing a first side wall segment comprising a first sheet having a first end, a second end, and an edge extending from the first end of the first sheet to the second end of the first sheet;

providing a second side wall segment comprising a second sheet having a first end, a second end, and an edge extending from the first end of the second sheet to the second end of the second sheet;

attaching the first end of each side wall segment to the gas distribution plate;

bending the first sheet at a first angle along a first crease that extends between the first end of the first sheet and the second end of the first sheet, so that a side portion of the first sheet extends between the first crease and the edge of the first sheet;

bending the second sheet at a second angle along a second crease that extends between the first end of the second sheet and the second end of the second sheet, so that a side portion of the second sheet extends between the second crease and the edge of the second sheet; and wherein the attaching step further comprises positioning the first and second side wall segments so that the edge of the first sheet is adjacent to the edge of the second sheet and so that said side portion of the first sheet is coplanar with said side portion of the second sheet.

10. A method according to claim 9, wherein both the first angle and the second angle are 45 degrees.

11. A method of suspending a gas distribution plate within a plasma chamber, comprising the steps of:

providing a chamber wall enclosing a chamber interior, wherein the chamber wall includes a back wall perforated by a gas inlet orifice;

mounting within the chamber interior a susceptor for supporting a workpiece;

positioning a gas distribution plate between the back wall and the susceptor, wherein the gas distribution plate is perforated by a number of gas outlet orifices;

providing a first side wall segment comprising a first sheet having a first end, a second end, and an edge extending from the first end of the first sheet to the second end of the first sheet;

providing a second side wall segment comprising a second sheet having a first end, a second end, and an edge extending from the first end of the second sheet to the second end of the second sheet;

attaching the first end of each side wall segment to the gas distribution plate;

bending the first sheet at a first angle along a first crease that extends between the first end of the first sheet and the second end of the first sheet, so that a side portion of the first sheet extends between the first crease and the edge of the first sheet; and bending the second sheet at a second angle along a second crease that extends between the first end of the second sheet and the second end of the second sheet, so that a side portion of the second sheet extends between the second crease and the edge of the second sheet;

wherein the attaching step comprises positioning the first and second side wall segments so that the edge of the first sheet is adjacent to the edge of the second sheet and so that said side portion of the first sheet is coplanar with said side portion of the second sheet.

12. A method according to claim 11, wherein both the first angle and the second angle are 45 degrees.

13. A method of mounting a gas distribution plate, comprising the steps of:

providing a gas distribution plate perforated by a number of gas outlet orifices;

providing a first side wall segment comprising a first sheet having a first end attached to the gas distribution plate, a second end, and an edge extending from the first end of the first sheet to the second end of the first sheet;

providing a second side wall segment comprising a second sheet having a first end attached to the gas distribution plate, a second end, and an edge extending from the first end of the second sheet to the second end of the second sheet;

forming a first bend in the first sheet so that the first bend extends between the first end of the first sheet and the second end of the first sheet and so that a side portion of the first sheet extends between the first bend and the edge of the first sheet;

forming a second bend in the second sheet so that the second bend extends between the first end of the second sheet and the second end of the second sheet and so that a side portion of the second sheet extends between the second bend and the edge of the second sheet; and positioning the first and second side wall segments so that the edge of the first sheet is adjacent to the edge of the second sheet and so that said side portion of the first sheet is coplanar with said side portion of the second sheet.

14. A method according to claim 13, wherein:

the step of forming the first bend comprises forming the first bend at a 45 degree angle; and the step of forming the second bend comprises forming the second bend at a 45 degree angle.

15. A method according to claim 14, wherein:

the gas distribution plate is rectangular and has first, second, third and fourth sides, wherein the first and second sides are perpendicular;

the first end of the the first side wall segment is attached to the first side of the gas distribution plate; and the first end of the the second side wall segment is attached to the second side of the gas distribution plate.

* * * * *